United States Patent [19]

Miyazaki et al.

[11] Patent Number: 5,187,367
[45] Date of Patent: Feb. 16, 1993

[54] CANTILEVER TYPE PROBE, SCANNING TUNNELING MICROSCOPE AND INFORMATION PROCESSING DEVICE EQUIPPED WITH SAID PROBE

[75] Inventors: Toshihiko Miyazaki, Hiratsuka; Hiroyasu Nose, Zama; Takayuki Yagi, Machida; Toshimitsu Kawase, Atsugi; Katsuhiko Shinjo, Isehara, all of Japan

[73] Assignee: Canon Kabushiki Kaisha, Tokyo, Japan

[21] Appl. No.: 742,436

[22] Filed: Aug. 8, 1991

[30] Foreign Application Priority Data

Aug. 14, 1990 [JP] Japan .................................. 2-213765
Sep. 19, 1990 [JP] Japan .................................. 2-251452

[51] Int. Cl.$^5$ ................................................ G11B 9/00
[52] U.S. Cl. .............................. 250/306; 250/442.11; 369/126
[58] Field of Search ........................... 250/306, 442.1; 369/126

[56] References Cited

U.S. PATENT DOCUMENTS 4,906,840  3/1990  Zdeblick et al. ..................... 250/306

FOREIGN PATENT DOCUMENTS 63-161552  7/1988  Japan .
63-161553  7/1988  Japan .

OTHER PUBLICATIONS

G. Binning et al., "Surface Studies by Scanning Tunneling Microscopy," Physical Review Letters, vol. 49, No. 1, pp. 57-60 (Jul. 2, 1982).
T. R. Albrecht et al., "Microfabrication of Integrated Scanning Tunneling Microscope," J. Vac. Sci. Technology, vol. 8, No. 1, pp. 317-318, (Jan./Feb. 1990).
E. E. Ehrichs et al., "Etching of Silicon (111) with the Scanning Tunneling Microscope," J. Vac. Sci. Technology, vol. 8, No. 1, pp. 571-572, (Jan./Feb. 1990).
U. Staufer et al., "Nanometer Scale Structure Fabrication with the Scanning Tunneling Microscope," Applied Physics Letters, vol. 51, No. 4, pp. 244-246 (Jul. 27, 1987).
H. Heinzelmann et al., "Topography and Local Modification of the $HoBa_2Cu_3O_{7-x}$ (001) Surface Using Scanning Tunneling Microscopy," Applied Physics Letters, vol. 53, No. 24, pp. 2447-2449 (Dec. 12, 1988).

Primary Examiner—Jack I. Berman
Attorney, Agent, or Firm—Fitzpatrick, Cella, Harper & Scinto

[57] ABSTRACT

A cantilever type probe comprises a cantilever-shaped displacement element having electrodes for driving which displace two layers of piezoelectric material at the interface and first and second surfaces of the layers, respectively, and each of the electrodes being arranged separately within the same plane, and a tip for information input and output connected to electrodes for drawing out arranged separately from the electrodes for driving at the free end of either one of the first and second surfaces of the element. A scanning tunneling microscopy or an information processing device comprises the cantilever type probe, a driver for driving the displacement element of the cantilever type probe and a bias or pulse voltage applicator for applying a bias or pulse voltage between a sample and the probe.

20 Claims, 9 Drawing Sheets

A-A

FIG. 12
FIG. 13
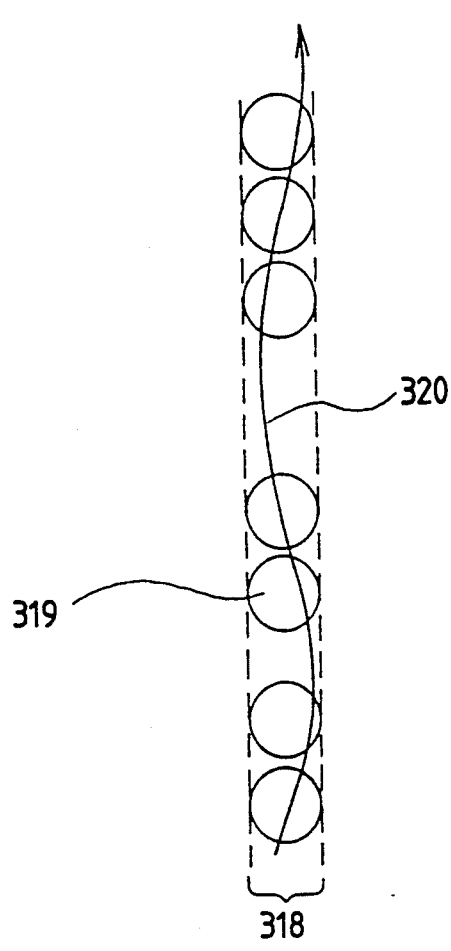
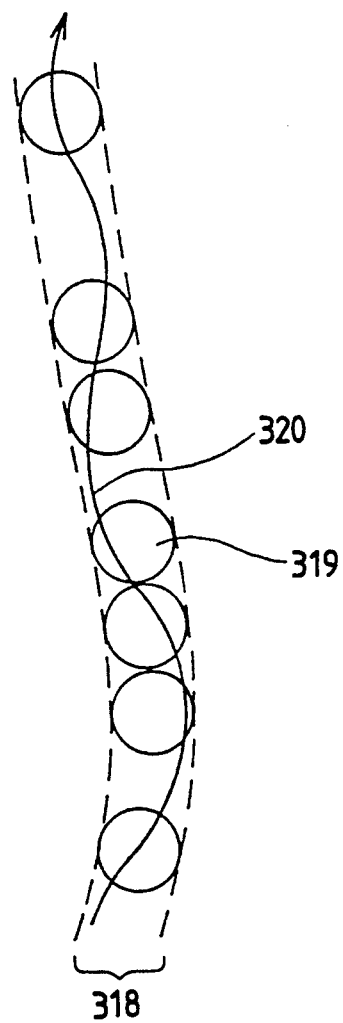

CANTILEVER TYPE PROBE, SCANNING TUNNELING MICROSCOPE AND INFORMATION PROCESSING DEVICE EQUIPPED WITH SAID PROBE

BACKGROUND OF THE INVENTION

1. Field of the Invention

This invention relates to a cantilever type probe to be used for scanning tunneling microscope (hereinafter abbreviated as STM) and so forth and a scanning tunnelling microscopy equipped with such probe.

Further, the present invention relates to a cantilever type probe which performs recording, reproduction and erasing, etc. of information according to the method of STM, and an information processing device equipped with the same.

2. Related Background Art

In recent years, scanning tunneling microscope (hereinafter abbreviated as STM) which can observe directly the electron structure of surface atoms of a conductor has been developed (G. Binnig et al., Phys. Rev. Lett. 49 (1982) 57), whereby real space image can be measured with remarkably high resolving power (nanometer or less) irrespectively of whether it may be single crystal or amorphous. STM utilizes the phenomenon that a current flows when a voltage is applied between a metal tip and an electrically conductive substance and distance between the both approaches about 1 nm. Since the current is very sensitive to the distance change between the both and will change exponentially, the surface structure of the real space can be observed with a resolving power of the atomic order by scanning the tip so as to maintain constantly the tunnel current. Analysis by use of STM is limited to electrically conductive materials, but it has now begun to be applied to the structural analysis of the insulation film formed thinly on the surface of electrically conductive materials. Further, because such device and means utilize the method of detecting minute current, they have also the advantage that no damage is given to the medium, and also observation can be made with low power. Also, since actuation in the air is also possible, a wide scope of application of STM has been expected.

Particularly, as proposed in Japanese Laid-open Patent Applications Nos. 63-161552, 63-161553, practical application as high density recording and reproduction device has been positively progressed. This performs recording by varying the voltage applied between the probe and the recording medium by use of the same probe as STM, and as the recording medium, materials exhibiting switching characteristics having memory characteristic in voltage-current characteristics, for example, thin film layers of chalocogenides, $\pi$-electron system organic compounds have been used. Reproduction is performed by the change in tunnel resistance between the region where recording is done and the region where no recording is done. As the recording medium for this recording system, recording and reproduction may be possible even on such medium with the surface shape of the recording medium being changed by the voltage applied on the probe.

When the operation of the STM or recording and reproduction applying STM are to be performed, important are the two points of controlling the distance between the probe and the sample or the recording medium on the Å order, and, in recording and reproduction, controlling the two-dimensional scanning of the probe on the several 10Å order for recording and reproducing the information arranged two-dimensionally on the medium. Further, from the standpoint of functional improvement of the recording and reproduction system, particularly acceleration of speed, it has been proposed to drive a large number of probes at the same time (multi-formation of probes). Shortly speaking, the relative position of the probe and the medium must be controlled three-dimensionally with the above precision within the area where a large number of probes are arranged.

In the prior art, for such control, lamination type piezoelectric elements, cylinder type piezoelectric elements, etc. mounted on the probe side or the medium side have been used. However, these elements, while they can take large displacement amounts, are not suitable for integration, and can be disadvantageously used for a multi-probe type recording and reproduction device. From this standpoint, the method of mounting the probe on a cantilever with a length of several 100 $\mu$m and driving the cantilever with a piezoelectric material has been considered.

In the prior art, as the preparation method of such cantilever, there is the method of preparing a cantilever having a multi-layer structure of piezoelectric material thin films, metal films, etc. according to the working technique to make a fine structure on one substrate by use of the semiconductor preparation process technique (T. R. Albrecht et al. "Microfabrication of integrated Scanning Tunneling microscope", Proceedings Fourth International conference on scanning tunneling microscopy/spectroscopy, 1989).

FIG. 4 shows a sectional view of the cantilever type probe of a prior art example. 101, 102 are piezoelectric material thin films, 103–107 are electrodes for driving piezoelectric materials, 108–111 dielectric material films, 112 a tip, and 113 an electrode for drawing out withdrawal. FIG. 5 shows a block diagram of the STM device by use of the cantilever type probe. 201 is a power source for bias application, 202 a tunnel current amplification circuit, 203 a driver for cantilever driving, 204 a cantilever, 205 a tip and 206 a sample. Here, by detecting the tunnel current $I_t$ flowing between the tip 205 and the sample 206, applying a feedback so that $I_t$ may be constant and driving the cantilever 204, the interval between the tip 205 and the sample 206 is maintained. FIG. 6 shows the equivalent circuit of the above STM device. $I_t$ is tunnel current, E bias power source, $R_i$ bias power internal resistance, $R_T$ tunnel resistance, $V_1$ power source for cantilever driving, $R_i'$ internal resistance, $C_1$ floating capacitance existing between driving electrode and substrate, $R_1$ substrate resistance, $C_2$ capacitance according to the constitution having the piezoelectric material thin film sandwiched between driving electrodes, $R_2$ resistance of the piezoelectric material, $C_3$ floating capacity existing between the electrode for drawing out and the driving electrode, $R_3$ its resistance, $V_2$ the electromotive force due to the piezoelectric effect of the piezoelectric material displaced by $V_1$, which may be considered to be $V_2=-V_1$. $C_4$ is the capacitance according to the constitution having the piezoelectric material thin film sandwiched between the electrode for drawing out and the driving electrode, and $R_4$ the resistance of that portion.

In the above prior art example, during tunnel current detection, the noise sources will be the current flowed in from $C_2$, $R_2$ portions and the current flowed in from $V_2$, $C_4$, $R_4$ portions in FIG. 6. Generally speaking, $C_2$ is not a lamination type so it has a small value, while $R_2$ is large, and therefore $V_2$, $C_4$ are substantially problems. Particularly, they are problems when the thickness of the laminated body constituting the cantilever is made small. For example, when the driving frequency is made 1 kHz at $V_1 = \pm 5$ V for driving the cantilever, and the cantilever length 1 mm, the piezoelectric material film thickness 1 μm, the width of the electrode for drawing out probe 20 μm, $V_2$ becomes ca. $\pm 5$ V, 1 kHz, $C_4$ ca. 1 pF, and the noise current $I_n$ becoming $I_n = C_4 \times dV_2/dt$ ca. 20 nA. Ordinarily, since $I_t =$ about 10 pA to 10 nA in STM device, such $I_n$ makes detection of tunnel current based on the sample information difficult. Particularly, in the recording and reproduction device by use of a cantilever type probe, high speed driving is required and hence the influence from $C_4$ is more serious.

Also, by use of the method of STM, there have been made studies about applications to various fields of observation evaluations, fine working of semiconductors or high molecular weight materials, etc. on the atomic order, molecular order (E. E. Ehrichs, 4th International Conference on Scanning Tunneling Microscopy/spectroscopy, '89, S13-3), and recording devices, etc.

Among them, in calculation information of computer or picture information, demands for recording devices having larger capacity are increasingly higher, and further because of calculation ability of the microprocessor which has been made smaller in size due to the progress of the semiconductor process technique, the recording device has been desired to be made smaller in size.

For the purpose of satisfying these demands, there has been proposed a recording and reproduction device with the minimum recording area of 10 nm square, which performs writing of a record by changing the work function of the recording medium surface by applying a voltage from a transducer comprising a probe for tunnel current generation existing on the driving means capable of fine control of the interval with the recording medium, and also performs reading of the information by detecting the change in tunnel current by the change in work function.

In such device, for improvement of transfer of information and recording speed, for example, it is required to increase the number of probes and permit them to run on the recording data series, while controlling the interval between the probes and the medium. However, the width of the data series recorded is very fine, and due to the influences of the drift by the temperature change of the device, or the vibration from the outside, etc., the probes will come off from the data series to make stable recording and reproduction impossible. Further, when one probe is scanned along the data series, other probes will come off from the data series.

SUMMARY OF THE INVENTION

Accordingly, a first object of the present invention is to provide a scanning tunnelling microscope, an information processing device which is improved in precision of tunnel current detection based on the information of a sample or a recording medium by reducing or making the value of the above $C_4$ 0 and is excellent in reliability, stability, and a cantilever type probe used for these.

Further, a second object of the present invention is to provide a cantilever type probe and an information processing device, a scanning tunneling current detection device which can satisfy the following (1) and (2) at the same time:

(1) to improve the transfer speed, and recording, production speed of information; and (2) to enable stable scanning without the probe scanning coming off from the data series on the recording medium even if outer disturbances such as drift by temperature of the device, vibration transmission from the outside to the device, etc. may be applied.

The present invention provides a cantilever type probe comprising a cantilever-shaped displacement element having electrodes for driving which displace two layers of piezoelectric material layers at the interface and upper and lower surfaces of said layers, respectively, and each of said electrodes being arranged separately within the same plane, and a tip for information input and output connected to electrodes for drawing out arranged separately from said electrodes for driving at the free end of either one of the first and second surfaces of said element.

The present invention also provides a cantilever type probe comprising a cantilever-shaped displacement element having electrodes for driving which displace two layers of piezoelectric material layers at the inerface and first and second surfaces of said layers, respectively, with each of said electrodes having a plurality of parts arranged within the same plane, and a tip for information input and output at the free end of either one of the first and second surfaces of said element.

The present invention further provides a scanning tunneling microscope, comprising any one of the cantilever type probe as specified above, a driving means for driving the displacement element of said cantilever type probe and a bias voltage application means for applying a bias voltage between a sample and the probe.

The present invention further provides an information processing device, comprising any one of cantilever type probes as specified above, a driving means for driving the displacement element of said cantilever type probe, a recording medium arranged proximate to said probe and a pulse voltage application means for applying a pulse voltage between the recording medium and the probe.

The present invention further provides an information processing device, comprising any one of cantilever type probes as specified above, a driving means for driving the displacement element of said cantilever type probe, a recording medium arranged proximate to said probe and a bias voltage application means for applying a bias voltage between the recording medium and the probe.

The present invention further provides an information processing device, comprising any one of cantilever type probes as specified above, a driving means for driving the displacement element of said cantilever type probe, a recording medium arranged proximate to said probe, a pulse voltage application means for applying a pulse voltage between the recording medium and the probe and a bias voltage application means for applying a bias voltage between the recording medium and the probe.

The present invention further provides an informatio processing device, comprising a plurality of any one of the cantilever type probes as specified above and arranged opposite to a recording medium, a driving means for driving the displacement element and a control means provided on each of said cantilever type probes, and also a pulse voltage application circuit for information recording capable of application between the recording medium and the probes.

The present invention further provides an informatio processing device, comprising a plurality of any one of cantilever type probes as specified above arranged as opposed to a recording medium, a driving means for driving the displacement element and a control means provided on each of said cantilever type probes, and also a bias voltage application circuit for information reproduction capable of application between the recording medium and the probes.

The present invention further provides an information processing device, comprising a plurality of any one of the cantilever type probes as specified above and arranged opposite to a recording medium, a driving means for driving the displacement element and a control means provided on each of said cantilever type probes, and also a pulse voltage application circuit for information recording and a bias voltage application circuit for information reproduction capable of application between the recording medium and the probes.

As the arrangement which does not give rise to the lamination type electric capacitance interfering with the input and output of information with a tip which is the specific feature of the present invention, the arrangement giving no overlapping of the electrode for drawing out with the electrode for driving at all in the thickness direction of the cantilever-shaped displacement element is particularly preferably, but the object of the present invention can be fully accomplished if the arrangement is such that the overlapping is 20% or less of the total area of the electrode for drawing out.

BRIEF DESCRIPTION OF THE DRAWINGS

FIG. 12 is an illustration of the probe scanning route.

FIG. 13 is a probe scanning route diagram when the track is deformed.

DETAILED DESCRIPTION OF THE PREFERRED EMBODIMENTS

The present invention is described below in more detail by referring to Examples.

EXAMPLE 1

Figure 1:
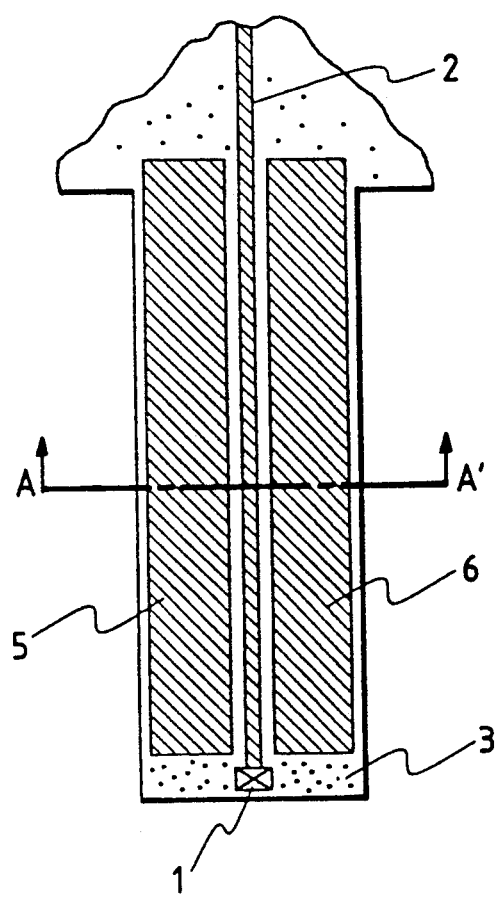
FIG. 1 is a plan view of the cantilever type probe of the present invention.
Figure 1:
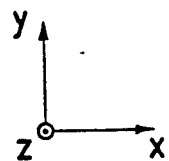
Figure 2:
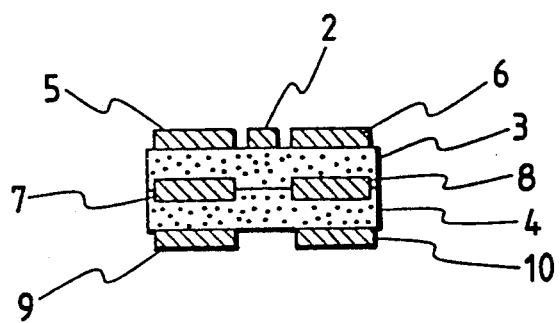
FIG. 2 is a sectional view taken along A—A' in FIG. 1.
Figure 2:
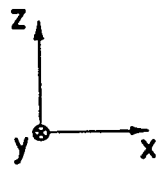

FIG. 1 shows a plan view of the cantilever type probe of the present invention. FIG. 2 is a sectional view taken along A—A' in FIG. 1. 1 is a tip, 2 an electrode for drawing out, 3 and 4 are piezoelectric material thin films, and 5-10 electrodes for driving piezoelectric materials. Here, the piezoelectric material thin films, electrodes, cantilevers were set as shown below.

Piezoelectric thin film: ZnO 0.3 $\mu$m in thickness
Electrode Al 0.15 $\mu$m
width: for driving, 20 $\mu$m for drawing out probe, 10 $\mu$m
Cantilever length: 400 $\mu$m
Cantilever width: 80 $\mu$m.

Here the electrode was divided into two in the x direction in order to drive triaxially the cantilever. The cantilever could be displaced $\pm 3$ $\mu$m in the z-axis direction by application of $\pm 4$ V, and $\pm$ 0.015 $\mu$m in the y-axis direction by application of $\pm 4$ V. The point in this Example is a point where there exists no electrode for driving 7,8 below (z-axis direction) the electrode for drawing out 2, so that an electric capacity between said electrodes 2 and 7 or 8 is extremely small. When the electric capacity between the electrode drawing out 2 and the electrodes for driving 5-10 was practically measured, it was found to be 0.1 pF or less which is the limit of the measuring instrument. The alternate current induced at the electrode for drawing out 2 when the piezoelectric material of the cantilever type probe was driven at $\pm 5$ V, f=100 through 1 kHz was measured to be 5 pA or less. For the purpose of reference, a cantilever type probe with the form of the electrodes for driving 7,8 in FIG. 2 being not divided was prepared with the same material and dimensions as in this Example, and evaluated similarly as in this Example. As the result, the electric capacity was about 1 pF, and the current induced about 5 nA. In this Example, ZnO is used as the piezoelectric material thin films 3, 4, but this is not limitative, but other piezoelectric materials such as AlN, TiBaO, PbZrTiO, PbTiO, etc. may be also used. Further, the dimensions of the cantilever are not limited to the values as mentioned above.

EXAMPLE 2

Figure 5:
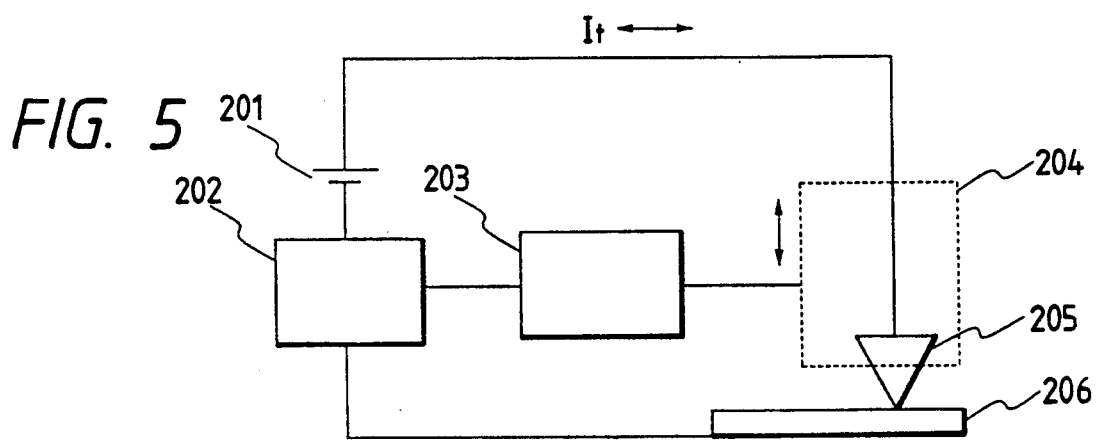
FIG. 5 is a block diagram of the STM device.
Figure 6:
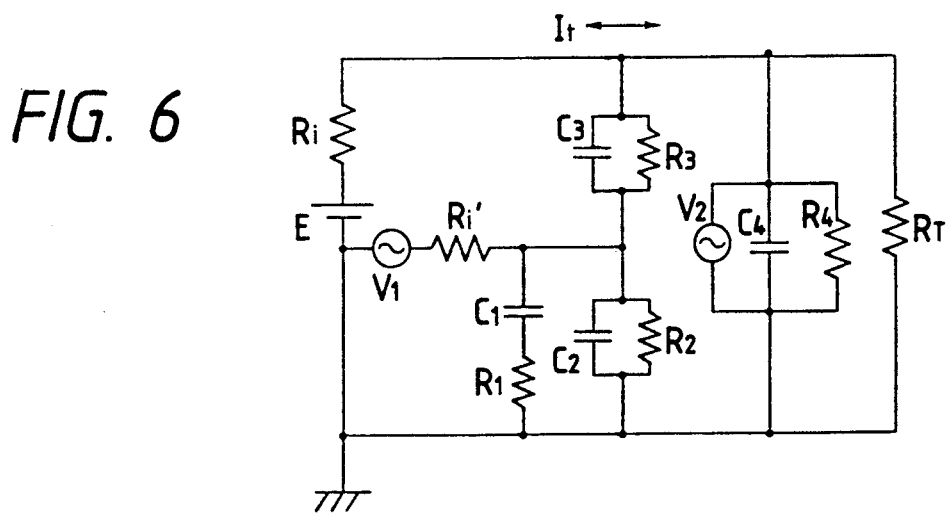
FIG. 6 represents an equivalent circuit view of the STM device.

An STM device by use of the cantilever type probe of Example 1 was prepared. The block diagram of the device is similar to FIG. 5. When an HOPG substrate is observed as the sample by this device at a bias current of 1 nA, a scan area of 100 Å×100 Å, good atomic image could be obtained. This image was also good even when the scanning speed was increased to several 100 Hz.

EXAMPLE 3

In this Example, the recording and reproduction device by use of a plural number of cantilever type probes of the present invention is described.

Figure 3:
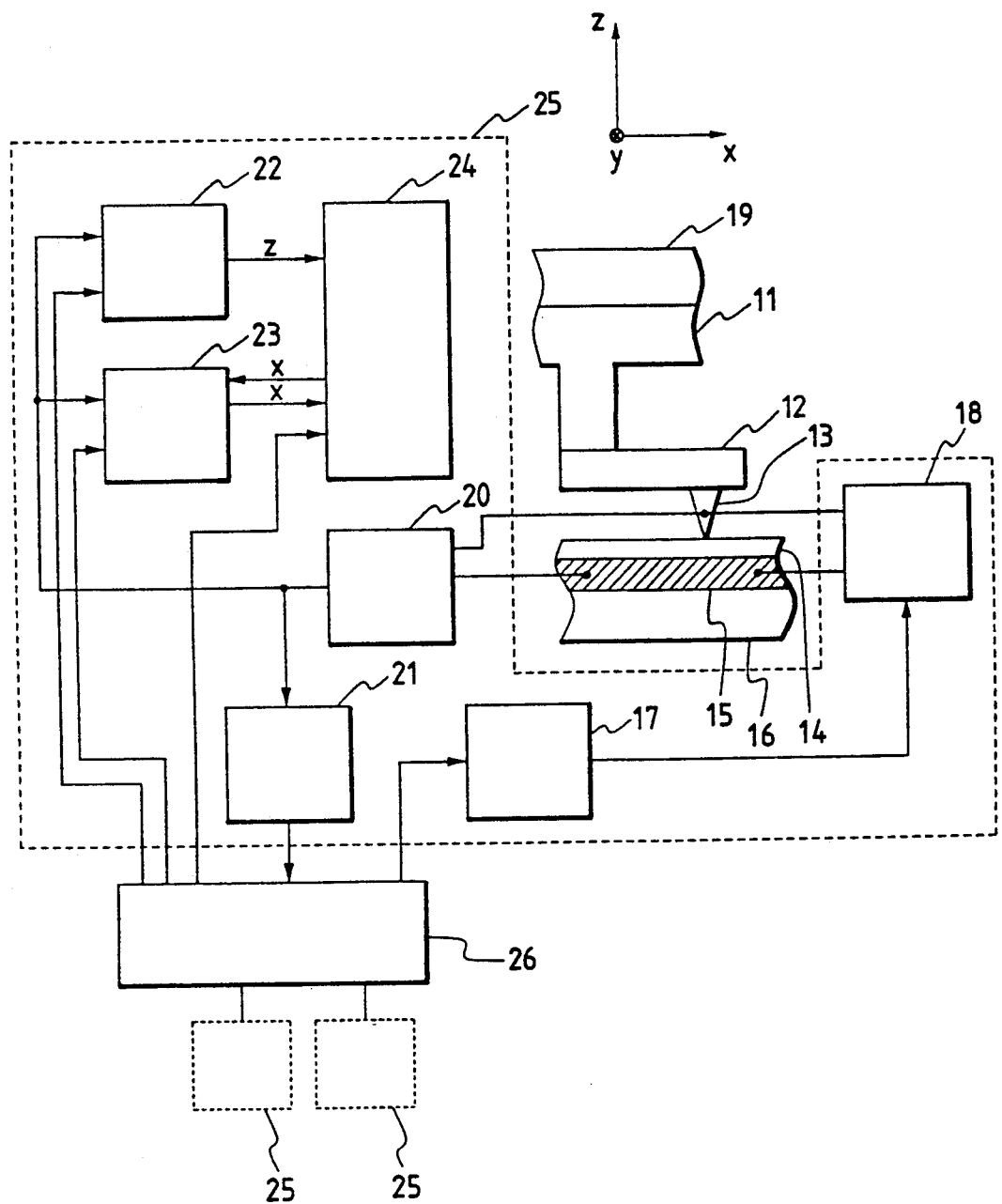
FIG. 3 is a block diagram of the information processing device of the present invention.
Figure 4:
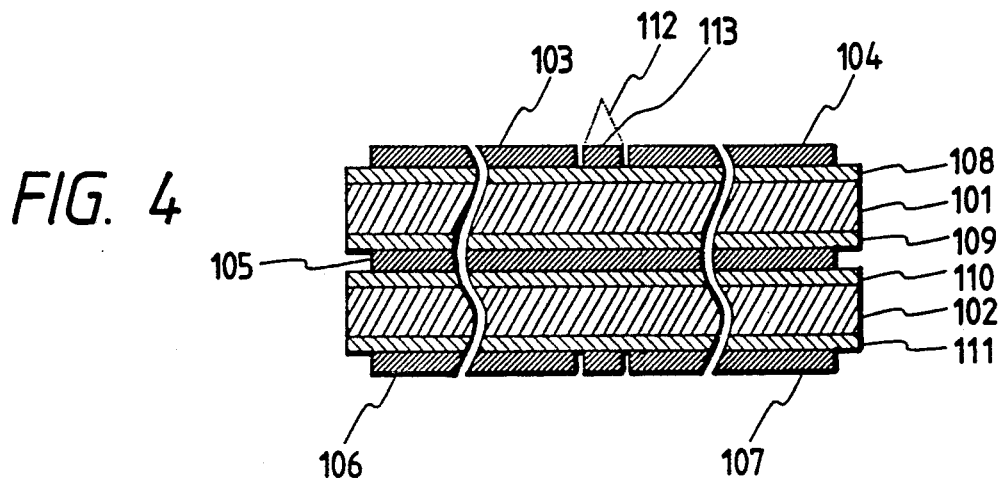
FIG. 4 is a sectional view of the cantilever type probe of the prior art.

FIG. 3 shows the constitution of the principal parts and the block diagram of this device. To describe based on this Figure, on the recording and reproduction head 11 are arranged the cantilever type probes 12 (In FIG. 3, only one of these is shown.). These plural number of tips 13 are arranged so as to be uniformly opposed to the medium. 14 is a recording medium for information recording, 15 a subbing electrode for applying voltage between the medium and the probes, and 16 a recording medium holder. As the recording medium, for example, a medium having the electric memory effect prepared by having Cr deposited to 50 Å according to the vacuum vapor deposition method as the subbing electrode 15 on a quartz glass substrate, and further Au vapor deposited to 300 Å thereon by the same method is used, and laminating four layers of SOAZ (squaryilium-bis-6-octylazulene) according to the LB method is used. 17 is a data modulating circuit which modulates the data to be recorded to signals suitable for recording, 18 a recording voltage applying device for recording the signals modulated in the data modulating circuit to the recording medium 14 by application of a voltage between the subbing electrode 15 and the tip 13. By approaching the tip 13 to the recording medium 14 to a predetermined distance, and applying a voltage exceeding the threshold value which causes change in electroconductivity to occur in the recording medium, for example, a rectangular pulse voltage of 3 V and a width of 50 ns, by the recording voltage applying device 18, the recording medium 14 will undergo characteristic changes to form a portion with low electrical resistance. By reforming this operation while scanning the tip 13 on the recording medium 14 by use of the X-Y stage 19, recording of the information is done. Although not shown, as the mechanism of scanning by the X-Y stage 19, there may be employed such control mechanism as cylinder type piezoactuator, parallel springs, differential micrometer, voice coil, inch worm, etc.

Also, the recording voltage applying device 18 is used for erasing of the recorded bit. More specifically, by approaching the tip 13 to the recorded bit on the recording medium 14 to a predetermined distance, and applying a triangular wave pulse voltage of a voltage exceeding the threshold value, for example, 7 V and a width of 50 ns, the recorded bit undergoes characteristic changes, whereby the electrical resistance becomes the same value as the portion where there is no recorded bit, thus effecting erasing of the recorded bit.

20 is a recording signal detection circuit which applies a bias voltage between the tip 13 and the recording medium 14 and detects the tunnel current flowing between both, 21 a demodulating circuit which demodulates the tunnel current signals detected by the recording signal detection circuit 20. During reproduction, the tip 13 and the recording medium 14 are set at a predetermined distance, and a voltage not exceeding the threshold value voltage, for example, a direct current voltage of 200 mV is applied between the tip 13 and the recording medium 14. The tunnel current signal detected by use of the recording signal detection circuit 20 during scanning with the tip 13 along the recording data series on the recording medium 14 under this state corresponds to the recording data signal. Therefore, by outputting the detected tunnel current signal by current-voltage conversion and demodulating it by the data demodulating circuit 21, a reproduced data signal can be obtained.

22 is a probe height detection circuit. The probe height detection circuit 22 receives the detected signal of the recording signal detection circuit 20, processes the signal remaining after cutting the vibration components of high frequency depending on presence or absence of the information bit, and emits command signals to the x, z-axis driving control circuit 24 for controlling the vertical movement of the tip 13 so that the remaining signal value may become constant. By this, the distance between the tip 13 and the medium 14 is maintained substantially constant.

23 is a track detection circuit. The track detecting circuit 23 is a route along which the data of the tip 13 should be recorded during scanning over the recording medium 14 by the tip 13 or the circuit for detecting the deviation from the data series recorded (hereinafter these are called the track).

As described above, it is required to displace the cantilever by the driving control circuit 24 so that the probe may run with vibration for tracking while controlling the distance between the tip 13 and the medium with the signal of the data series obtained in the track detection circuit 23.

The circuit for recording and reproduction 25 is formed by the data modulation circuit 17, the recording voltage application device 18, the recording signal detection circuit 20, the data demodulating circuit 21, the probe height detection circuit 22, the track detection circuit 23, the z-axis driving control circuit 24, the x, z-axis driving control circuit 24. Said circuit for recording and reproduction 25 is controlled by CPU 26 to become a recording and reproduction device.

It could be confirmed that writing, reading, erasing of recorded information could be done with the same probe by the recording and reproduction device of this Example.

Also, when reproduction is performed continuously at a speed of 100 kpbs, there was generated no tracking error, reproduction error. This indicates that good S/N (signed-to-noise ratio) can be maintained to high frequency by use of the cantilever type probe of the present invention.

EXAMPLE 4

This Example shows the cantilever type probe of the present invention.

Figure 7A:
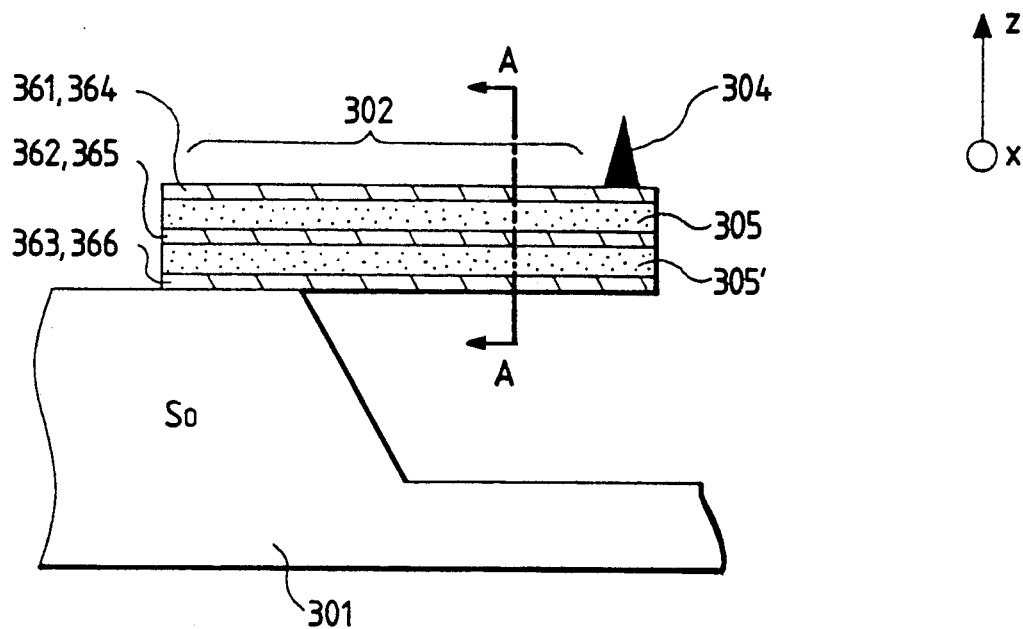
FIG. 7A and FIG. 7B are schematic constitutional views showing an example of the cantilever type probe of the present invention.
Figure 7B:
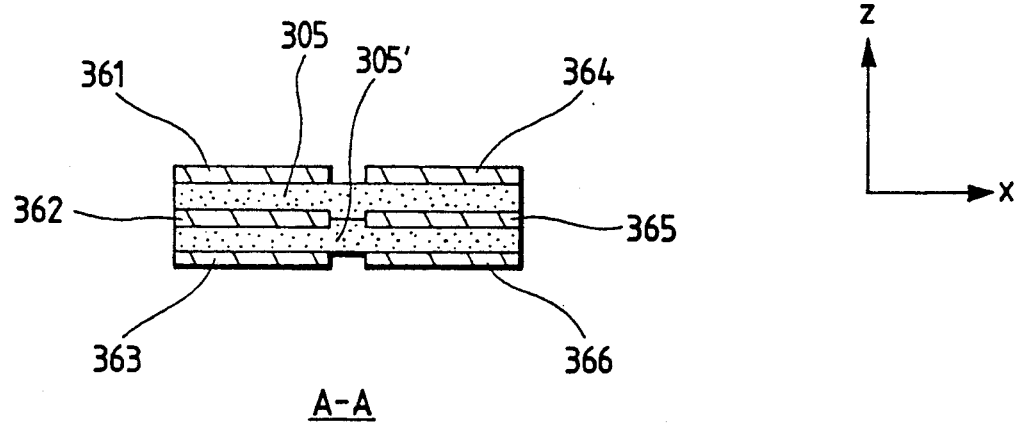

FIGS. 7A and 7B show, as an example thereof, details of piezoelectric material thin films 305, 305', and a displacement element constituted of electrodes 361-366 (six) for applying a bias voltage for displacing the piezoelectric materials. FIG. 7A is a constitutional view in the beam direction, and the present FIG. 7B a sectional view in the width direction taken along A—A in the present FIG. 7A. Here the cantilever 302 is formed by anisotropic etching from the surface of the Si (100 ) substrate 1. The electrodes 361-366, as shown in the present FIG. 7B, are juxtaposed in two sets in the width direction of the cantilever, and also six electrodes are arranged in layers so that the cantilever may be displaced in the x, z directions as described below through the balance of stretching and shrinking of the two layers of the piezoelectric material thin films 305, 305'.

Figure 8A:
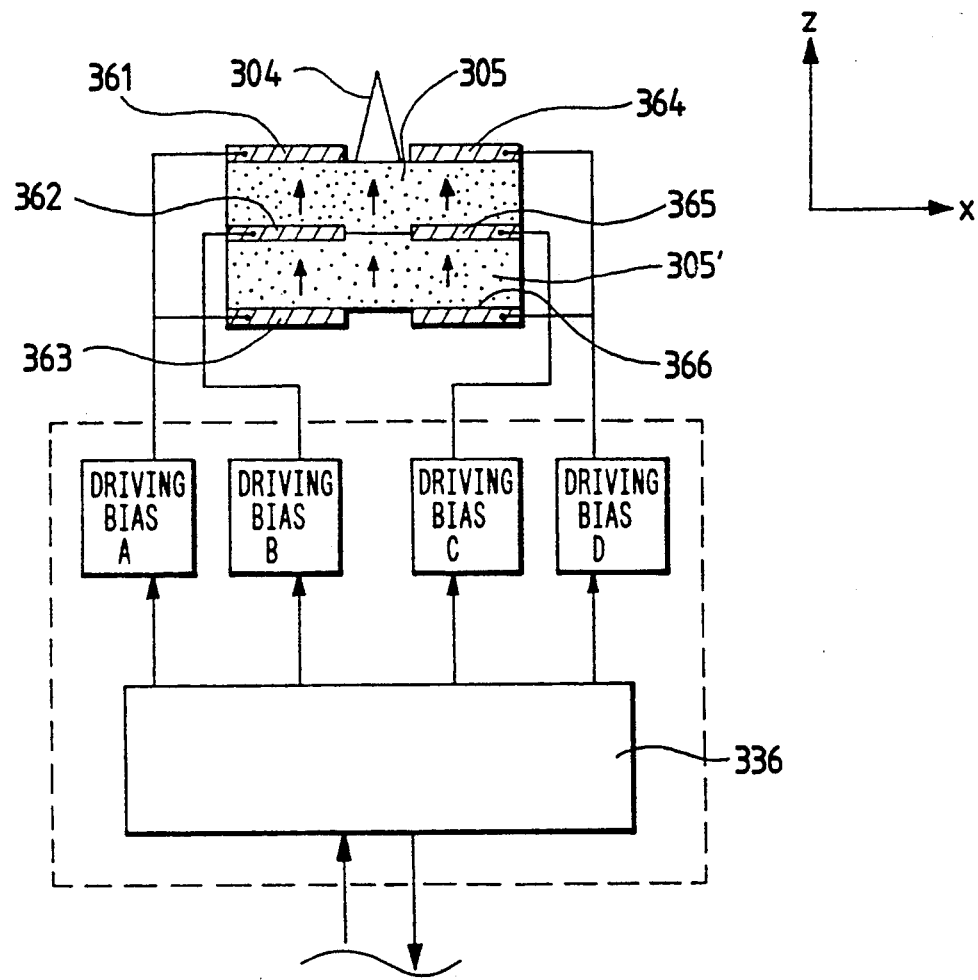
FIG. 8A and FIG. 8B are driving principle illustrations of the cantilever type probe of the present invention.
Figure 8B:
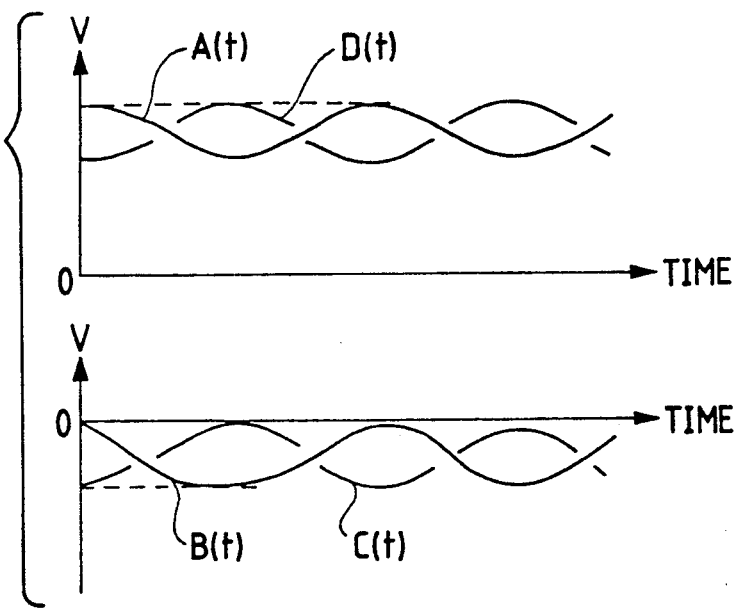
Figure 11A:
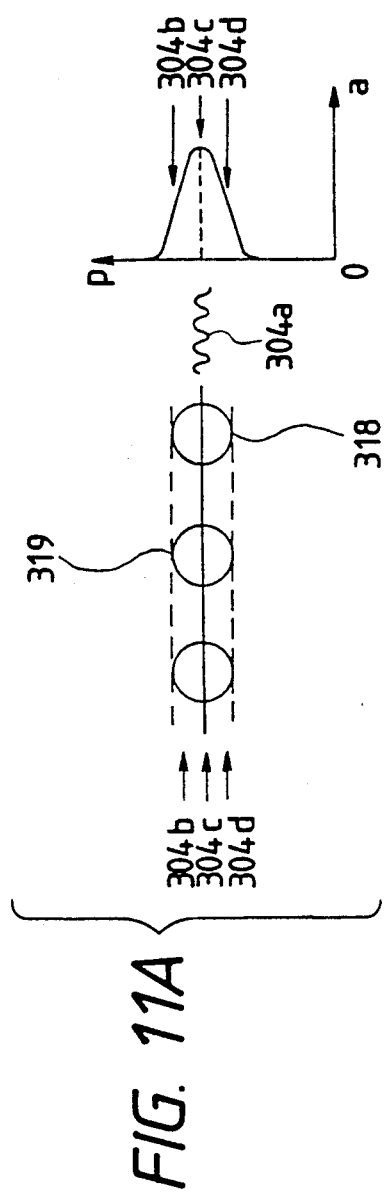
FIG. 11A and FIG. 11B are illustrations of tracking in the device of the present invention.
Figure 11B:
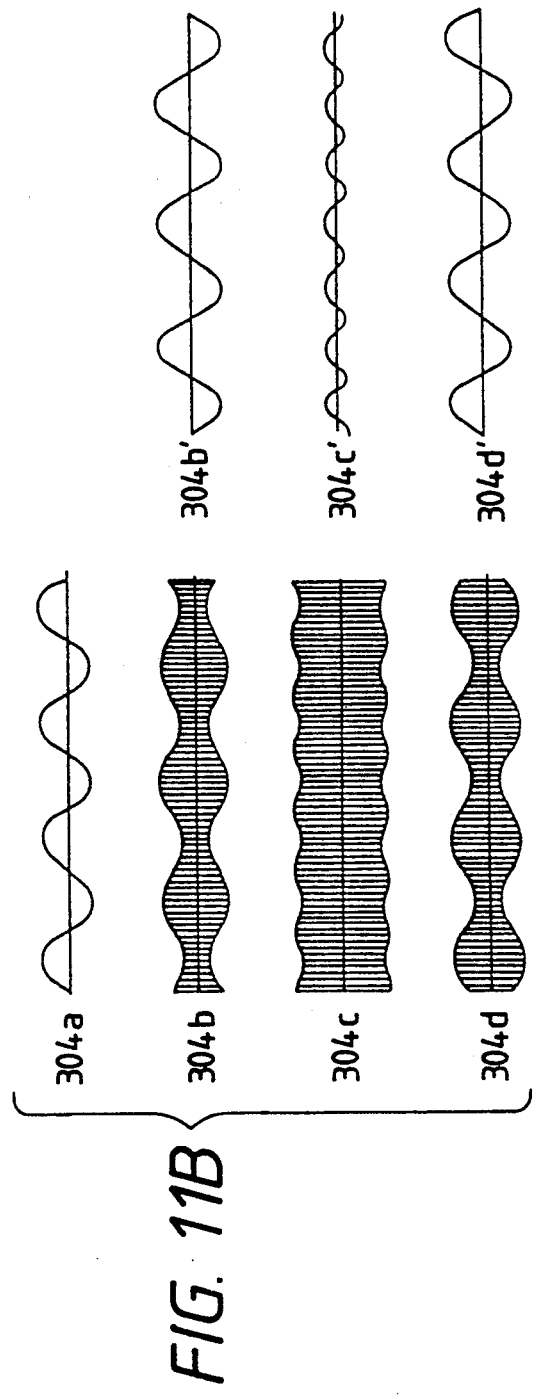

FIG. 8A and FIG. 8B are sectional views in the width direction of the cantilever type probe shown in FIG. 7A and FIG. 7B, showing an example of the bias voltage application method for displacement. Here, in order to stretch and shrink the piezoelectric material thin films 305, 305' so that the tip 304 can be vibrated on the track while controlling the interval between the tip 304 and the medium on which recording of information, etc. is performed, the electrodes 361-366 for driving piezoelectric materials are divided in the width direction of the beam to be arranged in two sets juxtaposed. These electrodes 361-366 are wired to the driving bias circuits A, B, C, D as shown in FIG. 8A and FIG. 8B, and further the bias voltage of the driving bias circuit will be controlled by the driving control circuit 336. The outline of dependency of the bias voltages A, B, C, D on time for the scanning route of the probe in FIG. 11A and FIG. 11B is shown in FIG. 8B. The interval between the probe 304 in the z-axis direction and the medium is controlled by the bias voltage given by A(t)-B(t) or D(t)-C(t). The frequencies of A(t), B(t), C(t), D(t) are coincident with the frequencies of the vibration wave forms in FIG. 11A and FIG. 11B of the tip 304. In FIG. 11A, p means the position of the track width direction, and "a" means the amplitude. The phases of A(t), B(t), C(t), D(t) will be deviated by 180°. The width of amplitude during vibration of the tip 304 is controlled by the bias voltage of B(t)-D(t). For example, when the bit diameter is made 50 Å, the piezoelectric material thin film, the electrode and the cantilever are set as follows:

Piezoelectric material thin film: ZnO 0.3 μm
Electrode: Al 0.1 μm
Cantilever length: 200 μm
Cantilever width: 40 μm.

The probe can be displaced at a displacement amount in the z-axis direction of ±2 μm at ±4 V, that is, by setting the bias voltage A(t)-(B(t) and D(t)-C(t) suitably at 4 V or less, the interval between the probe and the medium can be carried within the range from −2 μm to +2 μm. Also, by varying the bias voltage of B(t)-(D(t) by an absolute value of 1.5 V, it becomes possible to effect vibration of the bit diameter with 50 Å width.

EXAMPLE 5

This Example shows another embodiment of the cantilever type probe of the present invention.

Figure 9A:
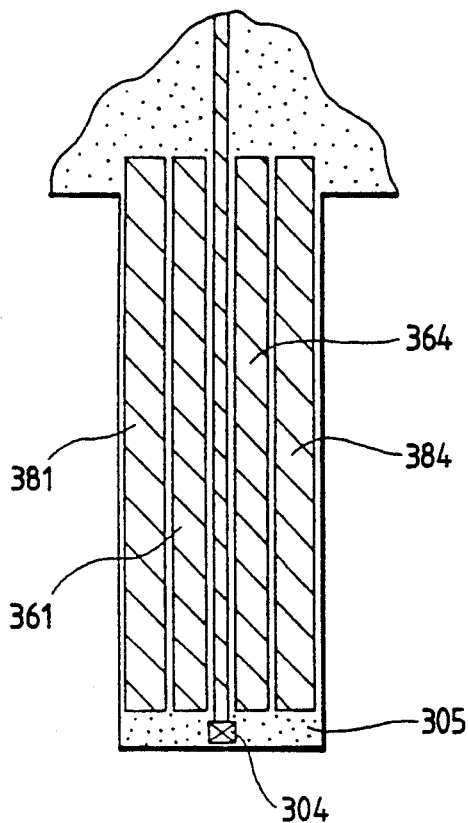
FIG. 9A, FIG. 9B, FIG. 10A and FIG. 10B are schematic constitutional views showing another example of the cantilever type probe of the present invention.
Figure 9B:
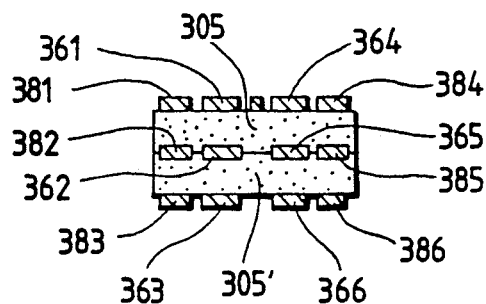

FIG. 9A is a top view of the cantilever type probe and the present FIG. 9B is its sectional view. In this Example, the arrangement is made to add further two sets of the electrodes of the probe in FIG. 7A and FIG 7B in the width direction of the cantilever.

This performs tracking by applying a driving bias voltage on the electrodes 361–366, similarly as shown in FIG. 8A and FIG 8B. By doing so, it becomes possible to scan the probe on the track as shown in FIGS. 11A, 11B and 12. However, due to thermal expansion of the medium, external vibration during recording with the probe, etc., deformation of the track as shown in FIG. 13 may sometimes take place. In such case, in the probe shown in FIGS. 7A and 7B as well as FIGS. 8A and 8B, not only the differences of B, D but also the absolute values will be changed correspondingly, but by use of the probe form shown in FIGS. 9A and 9B, by applying a bias voltage corresponding to the deformation of the track in the width direction of the cantilever on the electrodes 381–386, while vibrating similarly the electrodes 361–366, it becomes possible to perform positional control of the track width direction and the positional control relative to the deformation of the track as separate functions. Thus, by further addition of sets of electrodes in the width direction of the cantilever, deformations of different probes can be independently effected.

Figure 10A:
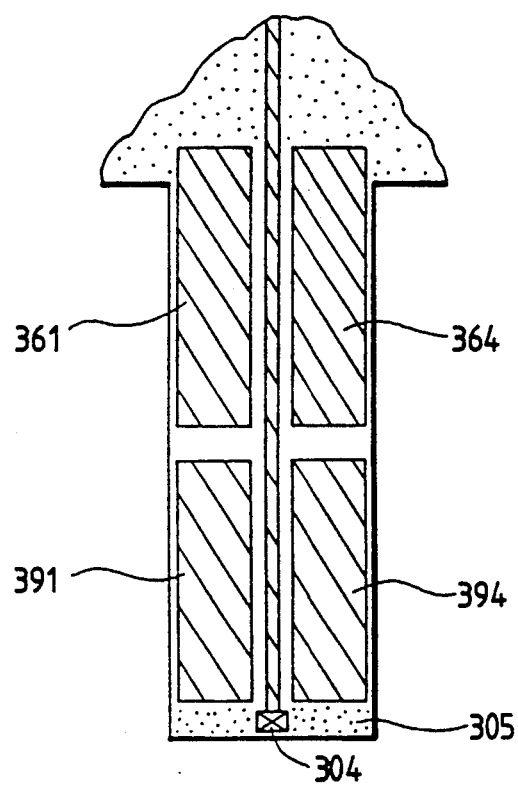
Figure 10B:
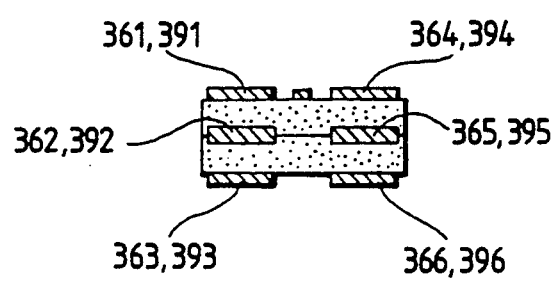

As the electrode form for the displacement element which performs deformations of different probes independently, four sets of electrode wirings can be also made in the length direction of the cantilever as shown in FIGS. 10A and 10B. By taking such electrode constitution, the same effect as the probe in FIGS. 9A and 9B can be obtained. Also, it becomes possible to control coarse movement and fine movement separately relative to the distance between the probe and the medium.

With the electrode constitution as described above, it becomes possible to provide a cantilever type probe which can effect the interval control between the probe and the medium while performing tracking.

The material for piezoelectric films 305, 305' used in both Examples as described above was ZnO, but this is not limitative, but other materials such as AlN, TiBaO, PbZrTiO, PbTiO, etc. having piezoelectric effect may be also employed.

EXAMPLE 6

In this Example, description is made about the information processing (recording and reproduction) device by use of a plural number of cantilever type probes of the present invention.

Figure 14:
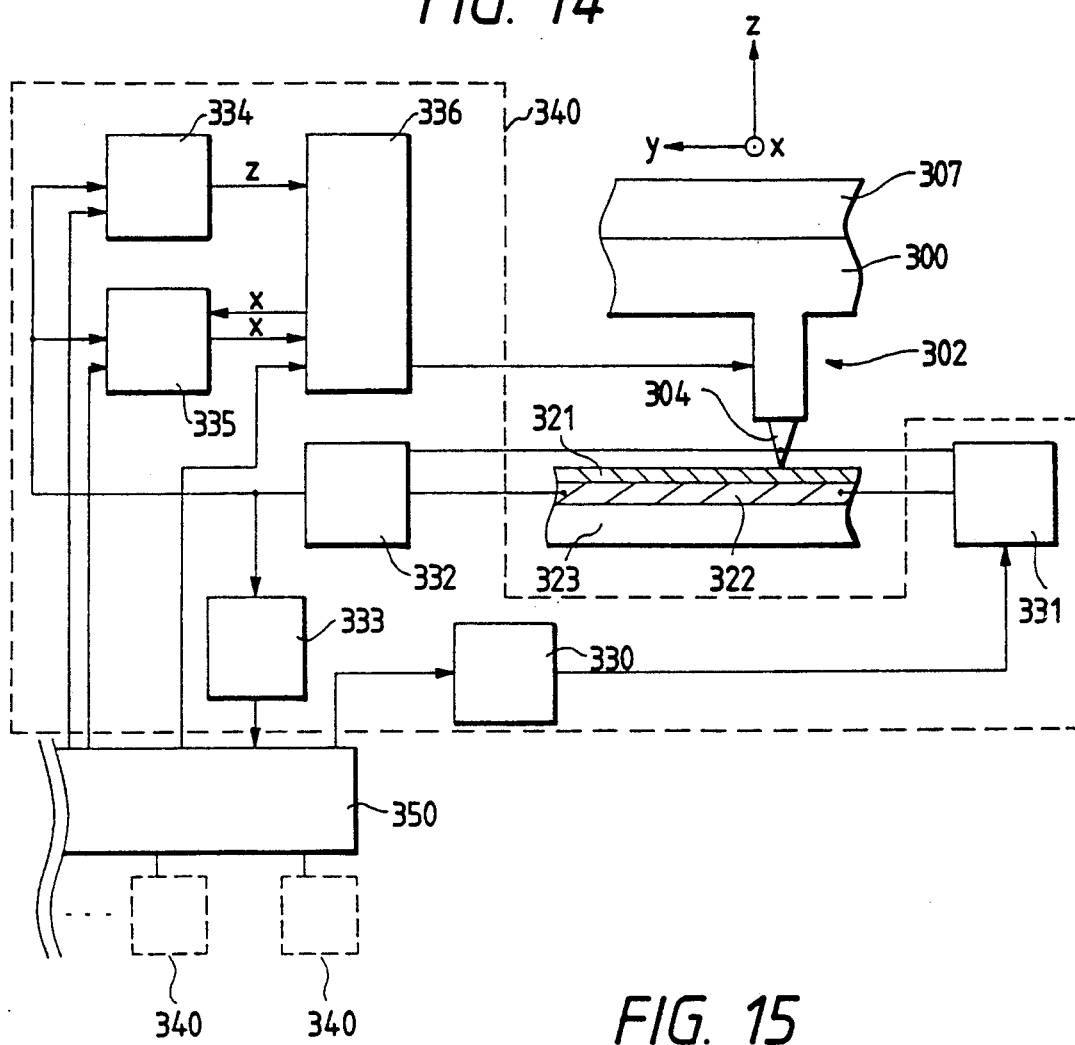
FIG. 14 is a schematic constitutional view of the information processing device of the present invention.

FIG. 14 shows the main constitutional parts and the block diagram of the present device. To describe the device based on this Figure, 350 is a CPU. On the recording and reproduction head 300 are arranged the cantilever type block probes 302 (In FIG. 14, only one of these is shown.). These plural number of tips 304 are arranged so as to be opposed uniformly to the medium. 321 is a recording medium for information recording, 322 a subbing electrode for applying a voltage between the medium and the probes, and 323 a recording medium holder. The recording medium comprises a recording medium layer, and the above recording medium layer comprises a metal, a semiconductor, an oxide, an organic thin film which can deform the shape of the recording medium by the tunnel current generated from the needle for tunnel current generation into a convex form (see Staufer, Appl. Phys. Letters, 51(4), Jul. 27, 1987, p. 244) or a concave form (see Heinzelmann, Appl. Phys. Letters, Vol. 53, No. 24, December, 1988, P. 2447), or an organic thin film layer which is changed in electrical properties by the above tunnel current, etc. The organic thin film which is changed in the above electrical properties may comprise preferably a Langmuir-Blodgett film (see Japanese Laid-open Patent Application No. 63-161552). For example, one prepared by depositing Cr to 50 Å according to the vacuum vapor depositing method as the subbing electrode 322 on a quartz glass substrate, further vapor depositing Au to 300 Å according to the same method thereon, and laminating 4 layers of SOAZ (squarylium-bis-6-octylazulene) according to the LB method thereon is used. 330 is a data modulating circuit which modulates the signals suitable for the data to be recorded, 331 a recording voltage application device for recording the signals modulated in the data modulating circuit on the recording medium 321 by applying a voltage between the recording medium 321 and the tip 304. When the tip 304 is approached to the recording medium 321 to a predetermined interval and a rectangular pulse voltage of, for example, 3 V, a width of 50 ns is applied by the recording voltage application device 331, the recording medium 321 will undergo characteristic changes, whereby a portion with low electrical resistance is formed. By performing this operation while scanning the recording medium 321 with the tip 304 by use of the X-Y stage 307, recording of information is done. Although not shown, as the mechanism for scanning by the X-Y stage 307, a control mechanism such as a cylinder type piezoactuator, parallel springs, differential micrometer, voice coil, inch worm, etc. may be employed.

332 is a recording signal detection circuit for detecting the tunnel current flowing between the tip 304 and the recording medium 321 by applying a voltage between both, 333 a data demodulating circuit for demodulating the tunnel current signal detected in the recording signal detection circuit 332. During reproduction, the tip 304 and the recording medium 321 are set at a predetermined interval, and a voltage lower than the recording voltage, for example, a direct current voltage of 200 mV is applied between the tip 304 and the recording medium 321. Under this state, the tunnel current signal detected by use of the recording signal detection circuit 332 during scanning along the recording data series on the recording medium 321 with the tip 304 corresponds to the recording data signal. Therefore, by outputting the tunnel current signal detected by current-voltage conversion and demodulating it by the data demodulating circuit 333, the reproduction data signal can be obtained.

334 is a probe height detection circuit. The probe height detection circuit 334 receives the detected signal of the recording signal detection circuit 332, processes the signal remaining after cutting the vibration components of high frequency depending on presence or absence of the information bit, and emits command signals to the x, z-axis driving control circuit 336 for controlling the vertical movement of the tip 304 so that the remaining signal value may become constant. By this, the distance between the tip 304 and the medium 321 is maintained substantially constant.

335 is a track detection circuit. The track detecting circuit 335 is a route along which the data of the tip 304 should be recorded during scanning over the recording medium 321 by the tip 304 or the circuit for detecting the deviation from the data series recorded (hereinafter these are called the track).

An example of such detection is shown. By the x, z-axis driving control circuit 336, the tip 304 is driven so that scanning may be done along the shape of the track. In this case, the tip 304 is adapted to be vibrated with an amplitude not higher than the width of the bit and at a frequency lower than the generated frequency of the bit in the direction crossing the juxtaposed direction of the bits within the track. The movement of the tip at this time is shown in FIG. 12. In the Figure, 318 is a track, 319 an information bit, 320 a scanning route of the tip. Here, the amplitude for each track width directional position of the tip of the tunnel current signal generated during passage of the tip on the bit is shown in FIG. 11A. Since the amplitude of the signal generated corresponding to the track width direction position of the tip thus changes, a modulated component corresponding to the frequency of the width direction vibration is added to the tunnel current signal detected by the tip which scans the track while vibrating in the width direction of the track. Here, the respective detected signals when the center of the width direction vibration is at the positions $304b$, $304c$, $304d$ in the width direction of the track are shown in FIG. 11B. Here, $304a$ is the vibration wave form in the width direction vibration of the tip, namely the control signal wave form in the width direction of the track given to the three-dimentional driving mechanism, when these signals are generated. The signals indicated by $304b$, $304c$, $304d$ in FIG. 11B comprise a mass of signals generated for passing each bit of the tip, but since individual signals are fine and large in amount, they are abbreviated in the drawing and shown only by an envelope.

As shown in FIG. 11B, the amplitude of the detection signal is subject to changes of the envelope as the signals $304b$, $304c$, $304d$ in FIG. 11B. Therefore, when the signals of the envelope are taken out by the whole wave rectifying, they become the signals $304b'$, $304c'$, $304d'$ in the same Figure. That is, for the vibration wave form $304a$ of the tip, its envelope signal becomes smaller as the tip shown by the arrowhead $304c$, while when deviated up as the arrowhead $304b$, the phase is deviated by 180° relative to the vibration wave form $304a$, whereby the amplitude also becomes larger and when deviated down as the arrowhead $304d$, it becomes the same phase relative to the vibration wave form $304a$ and also the amplitude becomes larger. Hence, when wave detection of the detected signal subjected to the whole wave rectifying is performed with the track width direction vibration control signal of the tip as the reference signal, a signal in proportion to the deviated amount from the center of the track is obtained. As shown in FIG. 14, by performing the above processing on the track detection circuit 335, and adding the signal obtained as the feedback signal to the x, z-axis driving control circuit 336, feed back control so as to maintain the tip 304, namely tracking is rendered possible.

In the processing as described above, when tracking only during reproduction is considered, the above-described tracking may be performed by use of the bit corresponding to the recorded information.

As to the tracking during recording, a plurality of bits are recorded for tracking at a plurality of places of which previous positions within the track are known, the recorded signals are detected by vibration of the tip 304 in the width direction of the track only when the tip 304 passes here to perform the tracking and the interval detection as described above, and when the tip 304 is moved to the recording region within the track, the command signals from the probe height detection circuit 334 and the track detection circuit 335 are stopped and at the same time the vibration in the width direction of the track may be discontinued.

As described above, it is required to displace the displacement element with the driving control circuit 336 so that the probe can run under vibration for tracking, while controlling the interval between the tip 304 and the medium by the signals of the data series obtained in the track detection circuit 335.

Figure 15:
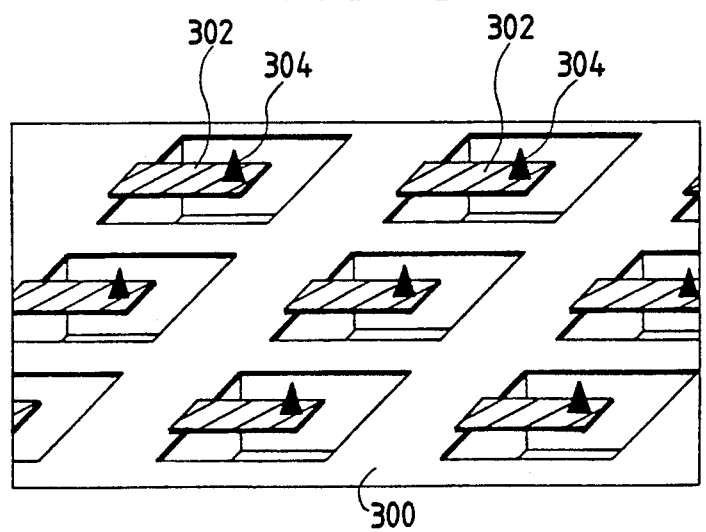
FIG. 15 is a schematic view of the recording and reproduction head according to the information processing device of the present invention.

The circuit for recording and reproduction 340 is formed of the data modulating circuit 330, the recording voltage applying device 331, the recording signal detecting circuit 332, the data demodulating circuit 333, the probe height detecting circuit 334, the track detecting circuit 335, the x, z-axis driving control circuit 336 as described above. In the recording and reproduction head 300 shown as an example in FIG. 15, the circuit for recording and reproduction 340 is provided on each of the plural number of probes opposed to the recording medium and the respective driving mechanisms, whereby such elements as recording with each probe, displacement control of each probe (tracking, interval control, etc.) are independently practiced.

All of the Examples as described above are recording and reproduction devices, but the present invention is applicable even to devices only of recording or reproduction or a scanning tunnelling current detection device including scanning tunneling microscopy, as a matter of course.

As the recording medium to be suitably used in the present invention, one comprising a substrate as mentioned above (electrode substrate) and a recording layer provided thereon, and yet having the memory-switching phenomenon (electric memory effect) in the current-voltage characteristics can be utilized.

The electric memory effect as mentioned in the present invention refers to such effect that at least two different resistance states are exhibited corresponding to the voltage application, the respective states are freely transitionable by application of a voltage or current exceeding the threshold value which changes the electroconductivity of the recording layer, and also the respective resistance states obtained can maintain their states so long as a voltage or current not exceeding the threshold value is applied.

Specific examples of the material constituting the recording layer may include, for example:

(1) amorphous semiconductors such as oxide glass or borate glass or chalcogenide glass containing Se, Te, As chemically bound with the group III, IV, V, VI elements of the periodic table, etc. They are genuine semiconductors with an optical band gap Eg of 0.6 to 1.4 eV or an electrical activation energy E of about 0.7 to 1.6 eV. Specific examples of chalcogenide glass may include the As-Se-Te system, the Ge-As-Se system, the Si-Ge-As-Te system, such as $Si_{16}Ge_{14}As_5Te_{65}$ (affixes are atomic %), or the Ge-Te-X system, the Si-Te-X system (X=small amount of the group V, VI elements), such as $Ge_{15}Te_{81}Sb_2S_2$.

Further, the Ge-Sb-Se system chalcogenide glass can be also used.

In an amorphous semiconductor layer having the above compound deposited on an electrode, by applying a voltage by use of a probe electrode in the vertical direction to the film surface, the electric memory effect of the medium can be exhibited.

As the deposition method of such material, the thin film forming technique known in the art can be utilized to accomplish sufficiently the object of the present invention. For example, suitable film forming methods can include the vacuum vapor deposition method, the cluster ion beam method, etc. Generally speaking, the electric memory effect of such material is observed with a film thickness of several $\mu m$, but a film thickness of 1 $\mu m$ or less is preferable from the standpoints of uniformity, recordability, and further a material with a film thickness of 500 Å or less is more preferable.

Also, from the standpoint of the recording resolving power as the recording medium, the recording should be desirably as thin as possible, further preferably in the range of from 30 Å to 200 Å.

(2) Further, there can be included organic semiconductor layers having a salt of an electron-acceptable compound such as tetraquinodimethane (TCNQ), TCNQ derivatives, for example, tetrafluorotetracyanoquinodimethane ($TCNQF_4$), tetracyanoethylene (TCNE) and tetracyanonaphthoquinodimethane (TNAP) with a metal with a relatively lower reduction potential such as copper or silver deposited on an electrode.

As the formation method of such organic semiconductor layer, there may be employed the method in which the above-mentioned electron-acceptable compound is vacuum vapor deposited on an electrode of copper or silver.

The electric memory effect of such organic semiconductor is observed with a film thickness of about some 10 $\mu m$ or less, but from the standpoints of film formability, uniformity, one with a film thickness of 1 $\mu m$ or less, further 30 Å to 500 Å is preferable.

(3) Further, a recording medium having a molecule having a group having a $\pi$-electron level and a group having only a $\sigma$-electron level in combination laminated on an electrode may be employed.

As the structure of the dye having the $\pi$-electron system suitable for the present invention, there may be included the dyes having porphylline skelton such as phthalocyanine, tetraphenylporphylline, etc., azulene type dyes having squarilium group and croconicmethine group as the bonding chain and cyanine type analogous dyes having two nitrogen-containing heterocyclic rings such as quinoline, benzothiazole, benzooxazole, etc. bonded through squarilium group and croconicmethine group, or cyanine dyes, fused polycyclic aromatics such as anthracene, pyrene, etc., and chain compounds of polymerized aromatic and heterocyclic compounds and polymers of diacetylene group, further tetraquinodimethane or tetrathiafluvalene derivatives and analogues thereof and charge transfer complexes thereof, and further metal complex compounds such as ferrocene, trisbipyridine ruthenium complexes, etc.

In addition to the low molecular weight materials as mentioned above, various high molecular weight materials can be also utilized.

For example, addition polymers such as polyacrylic acid derivatives, etc., condensed polymers such as polyimide or polyphenylene, polythiophene, etc., ring-opened polymers such as nylon, etc., or biological high molecular weight materials such as polypeptide, bacteriorhodopsin, etc. can be included.

Concerning formation of an organic recording medium, although specifically the vapor deposition method or the cluster ion beam method, etc. may be also applicable, the LB method is extremely suitable among the known prior art techniques from controllability, easiness and reproducibility.

As described above, in the present invention, by avoiding the constitution in which a piezoelectric material is sandwiched between the driving electrode and the electrode for the drawing out probe in a cantilever type probe, it becomes possible to detect precisely a tunnel current. Further, this enables use even of a high frequency region, and use of said cantilever type probe, a stable STM image with stable high S/N ratio can be obtained. Also, by applying to an information processing device, a device of high speed, high stability, high reliability can be prepared.

Also, in the present invention, according to the cantilever type probe which has been made so as to perform independently the interval control between the probe and the medium and tracking by arranging a piezoelectric thin film and two or more sets of electrodes with respect to the cantilever width direction, even if temperature change of the device, vibration from the outside, thermal expansion of the medium, etc. may be generated, it has become possible to perform input or reading of information always stably with all the probes.

We claim:

1. A cantilever type probe comprising a cantilevered-shape displacement element having two layers of piezoelectric material and first second and third pairs of driving electrodes which displace said two layers of piezoelectric material at an interface thereof and first and second surfaces of said displacement element, respectively, and each electrode of said pairs of driving electrodes being arranged separately within the same plane, and a tip for information input and output connected to a seventh electrode for drawing out information arranged separately from any of said driving electrodes at a free end of either one of said first and second surfaces of said displacement element.

2. A probe according to claim 1, wherein said driving electrodes and said seventh electrode for drawing out information are arranged so as to have to have no overlapping surface in a thickness direction of said displacement element.

3. A probe according to claim 1, wherein said seventh electrode for drawing out information is provided so that an overlapping surface with said driving electrodes may be 20% or less of the total area of said seventh electrode in a thickness direction of said displacement element.

4. A probe according to claim 1, wherein said seventh electrode for drawing out is arranged between said driving electrodes separated on the same plane.

5. A cantilever type probe comprising a cantilever-shaped displacement element having two layers of piezoelectric material and first, second and third sets of driving electrodes which displace said two layers of piezoelectric material at an interface thereof and first and second surfaces of said displacement element, respectively, and each of said sets of driving electrodes having a plurality of parts arranged on the same plane, and a tip for information input and output at a free end of either one of said first and second surfaces of said element.

6. A probe according to claim 5, further having an additional electrode for drawing out information input and output which is independent of said driving electrodes and being connected to said probe.

7. A probe according to claim 1, wherein said driving electrodes and said seventh electrode for drawing out are juxtaposed on the same plane.

8. A probe according to claim 6, wherein said driving electrodes and said seventh electrode for drawing out are juxtaposed on the same plane.

9. A probe according to claim 1, wherein said displacement element is displaced through the reverse piezoelectric effect.

10. A probe according to claim 5, wherein said displacement element is displaced through the reverse piezoelectric effect.

11. A scanning tunneling microscope, comprising a cantilever type probe according to any one of claims 1 to 10, driving means for driving said displacement element of said cantilever type probe and a bias voltage application means for applying a bias voltage between a sample and said probe.

12. An information processing device, comprising a cantilever type probe according to any one of claims 1 to 10, driving means for driving said displacement element of said cantilever type probe, a recording medium arranged proximate to said probe and a pulse voltage application means for applying a pulse voltage between said recording medium and the probe.

13. An information processing device, comprising a cantilever type probe according to any one of claims 1 to 10, driving means for driving said displacement element of said cantilever type probe, a recording medium arranged proximate to said probe and a bias voltage application means for applying a bias voltage between said recording medium and the probe.

14. An information processing device, comprising a cantilever type probe according to any one of claims 1 to 10, driving means for driving said displacement element of said cantilever type probe, a recording medium arranged proximate to said probe, a pulse voltage application means for applying a pulse voltage between said recording medium and said probe and a bias voltage application means for applying a bias voltage between said recording medium and said probe.

15. An information processing device, comprising a plurality of cantilever type probes according to any one of claims 1 to 10 arranged to oppose a recording medium, driving means for driving said displacement element, control means provided on each of said cantilever type probes, and a pulse voltage application circuit for information recording capable of application between said recording medium and said probes.

16. An information processing device, comprising a plurality of cantilever type probes according to any one of claims 1 to 10 arranged to oppose a recording medium, driving means for driving said displacement element, control means provided on each of said cantilever type probes, and a bias voltage application circuit for information reproduction capable of application between said recording medium and said probes.

17. An information processing device, comprising a plurality of cantilever type probes according to any one of claims 1 to 10 arranged to oppose a recording medium, driving means for driving said displacement element, control means provided one each of said cantilever type probes, and a pulse voltage application circuit for information recording and a bias voltage application circuit of information reproduction capable of application between said recording medium and said probes.

18. An information processing device according to claim 15, wherein said control means changes the bias voltage for displacing said displacement element based on the detection result of the tunnel current flowing between said recording medium and said probe, and giving the signal to the electrodes constituting said displacement element.

19. An information processing device according to claim 16, wherein said controls means changes the bias voltage for displacing said displacement element based on the detection result of the tunnel current flowing between said recording medium and said probe, and giving the signal to the electrodes constituting said displacement element.

20. An information processing device according to claim 17, wherein said control means changes the bias voltage for displacing said displacement element based on the detention result of the tunnel current flowing between said recording medium and said probe, and giving the signal to the electrodes constituting said displacement element.

* * * * *

UNITED STATES PATENT AND TRADEMARK OFFICE
CERTIFICATE OF CORRECTION

PATENT NO. : 5,187,367
DATED : February 16, 1993
INVENTOR(S) : Toshihiko Miyazaki, et al.

It is certified that error appears in the above-indentified patent and that said Letters Patent is hereby corrected as shown below:

[56] REFERENCES CITED: ON THE TITLE PAGE:

FOREIGN PATENT DOCUMENTS, insert --0381113  8/1990  European Pat. Off.-- and --89-07256  8/1989  PCT--.
OTHER PUBLICATIONS, insert --Shinya Akamine, et al., "Microfabricated Scanning Tunneling Microscope", IEEE Electron Device Letters, Vol. 10, No. 11, pp. 490-492 (November 1989)--.

COLUMN 2:

Line 61, "$V_2 - -V_1$." should read --$V_2-(-V_1)$.--.

COLUMN 4:

Line 7, "production" should read --reproduction--.

COLUMN 5:

Line 6, "informatio" should read --information--.

COLUMN 6:

Line 17, "for drawing" should read --¶ for drawing--.
Line 46, "AlN," should read --AlN,--.

UNITED STATES PATENT AND TRADEMARK OFFICE
CERTIFICATE OF CORRECTION

PATENT NO. : 5,187,367
DATED : February 16, 1993
INVENTOR(S) : Toshihiko Miyazaki, et al.

It is certified that error appears in the above-indentified patent and that said Letters Patent is hereby corrected as shown below:

COLUMN 11:

Line 61, "from" should read --form--.

COLUMN 14:

Line 63, "shape" should read --shaped--.

COLUMN 16:

Line 35, "one" should read --on--.
Line 49, "controls" should read --control--.
Line 58, "detention" should read --detection--.

Signed and Sealed this

Fifteenth Day of March, 1994

BRUCE LEHMAN

Attest:

Attesting Officer

Commissioner of Patents and Trademarks